United States Patent [19]

Nakatani et al.

[11] Patent Number: 4,843,520
[45] Date of Patent: Jun. 27, 1989

[54] ELECTRONIC CIRCUIT MODULE

[75] Inventors: Yoshio Nakatani, Toyonaka; Tooru Tamura, Ikeda; Mikio Nozu, Yamatokouriyama; Takahiro Manabe, Katano, all of Japan

[73] Assignee: Matsushita Electric Industrial Co. Ltd., Osaka, Japan

[21] Appl. No.: 151,904

[22] Filed: Feb. 3, 1988

[30] Foreign Application Priority Data

Feb. 3, 1987 [JP] Japan .................................. 62-22751
Apr. 13, 1987 [JP] Japan .................................. 62-90208

[51] Int. Cl.⁴ ............................................. H05K 1/14
[52] U.S. Cl. ................................... 361/395; 361/386; 361/394; 361/398; 361/399
[58] Field of Search ................... 165/80.2, 80.3; 174/17 SF, 17 VA, 52 PE; 357/72, 80, 81; 361/380, 382, 386–389, 394, 395, 398, 399, 424; 439/67, 77, 494–495, 499

[56] References Cited

U.S. PATENT DOCUMENTS 3,699,374 10/1972 Schuler .............................. 361/395
4,707,763 11/1987 Kudo ................................. 361/386

FOREIGN PATENT DOCUMENTS 0200221 11/1986 European Pat. Off. ............ 361/386
3502584 7/1986 Fed. Rep. of Germany ...... 361/386
1258488 12/1971 United Kingdom ................ 361/388

Primary Examiner—A. D. Pellinen
Assistant Examiner—Gregory D. Thompson
Attorney, Agent, or Firm—Wenderoth, Lind & Ponack

[57] ABSTRACT

An electronic circuit module comprises a case, first and second substrates disposed in the case on opposite inner walls with a gap therebetween and, a flexible film having a circuit pattern thereon and attached at a part to the first substrate and attached at another part to the second substrate. A first group of electronic components including a heat-generating component are mounted on the film part attached to the first substrate. A second group of electronic components including a low-heat-resistive component are mounted on the film part attached to the second substrate. The gap between the first and second substrates is filled with a resin layer, preferably a foam resin layer, having a low heat conductivity so as to prevent a heat transfer from the heat-generating part to the low-heat-resistive part.

14 Claims, 3 Drawing Sheets

ELECTRONIC CIRCUIT MODULE

BACKGROUND OF THE INVENTION

1. Field of the Invention

The present invention relates to a functional electronic circuit module made by packaging a plurality of electronic parts, including parts generating a large amount of heat (heat-generating parts) and parts having low heat resistance (low-heat-resistive parts).

2. Description of the Prior Art

In recent years, along with the remarkable developments in car electronics, electronic circuits have come to be used in the essential parts of a car, including various automatic control devices and instrument panels. Accordingly, there exists a need for an electronic circuit module which is thin, light, high in packaging density, and excellent in vibration resistance. Since it is necessary to install electronic circuit parts including heat-generating parts and low-heat-resistive parts in a limited space, a high density electronic circuit module must have the electronic circuit parts mounted on a substrate such as a paper phenol substrate, glass epoxy substrate, polyester substrate and composit substrate, which has a conductor on one side or both sides thereof.

A heat-generating part such as a thyristor, power transistor or triode AC switch (TRIAC), is usually provided with a heat radiating fin, through which heat is not sufficiently released. Therefore, it is necessary to provide an allowance of about a 30° C. temperature rise from the atmosphere temperature. On the other hand, a semiconductor part such as an LSI or IC used in a microcomputer is required to have high accuracy and high reliability, generates little heat, and has a maximum operating temperature of about 85° C. If the use of semiconductors in the direct sun in midsummer or in desert is considered, it is necessary to assume that the maximum atmosphere temperature is 80° C. In such a case, there is little room for allowance between the maximum atmosphere temperature and the maximum operating temperature. On the other hand, the electronic circuit module is a high density part in which heat-generating parts and a low-heat-resistive parts are densely packaged without a sufficient distance therebetween. Since any minor malfunction in the electronic circuit module used in the essential parts of vehicles such as automobiles can lead to personal injury, high accuracy and high reliability of such an electronic circuit module are strictly demanded. High accuracy and high reliability are also required with respect to the temperature stress, for example, in starting the engine in cold weather and or to vibration stress while driving on a rough road at high speed.

SUMMARY OF THE INVENTION

An object of the present invention is to provide an electronic circuit module which prevents heat transfer to low-heat-resistive parts from heat-generating parts and possesses high accuracy and high reliability with respect to temperature stress and vibration. To achieve the above objectives, an electronic circuit module is disclosed comprising: a case; first and second substrates; a flexible film with a circuit pattern formed thereon; a first group of electronic parts including a heat generating part; a second group of electronic parts including a low-heat-resistive part; and, a resin layer. The first and second substrates are attached to opposite inner walls of the case and have mounted thereon the first and second groups of electronic parts respectively. The resin layer is used to fill the gap formed between the first and second groups of electronic parts so that heat generated by the heat generating part is not transferred to the low-heat-resistive part.

Preferably, the heat-generating part is covered with a resin having a high heat conductivity so that heat generated by the heat-generating part is released through a large area.

Preferably, the first substrate has a high heat conductivity so that heat generated by the heat-generating part is releast at a fast rate through the high-heat-conductive substrate.

Preferably, the resin layer filling the gap between the first and second groups of electronic circuit is a cushiony foam resin body so as to be much lower in heat conductivity and to absorb mechanical vibration or shock.

The above and other objects and features of the present invention will be apparent from the following description taken in connection with the accompanying drawings in which:

BRIEF DESCRIPTION OF THE INVENTION

FIG. 1 is a cross sectional view of an electronic circuit module of a first embodiment according to the present invention, FIG. 2 is a perspective view of a case of the first embodiment, FIG. 3 is a cross sectional view of an electronic circuit module of a second embodiment acccording to the present invention, FIG. 4 is a perspective view of a case of the second embodiment, FIG. 5 is a cross sectional view of an electronic circuit module of a third embodiment according to the present invention, FIG. 6 is a cross sectional view of an electronic circuit module of a fourth embodiment according to the present invention, FIG. 7 is a cross sectional view of an electronic circuit module of an example for comparison, and FIG. 8 is a cross sectional view of an electronic circuit module of another example for comparison.

DESCRIPTION OF THE PREFERRED EMBODIMENTS

Embodiment 1

Figure 1:
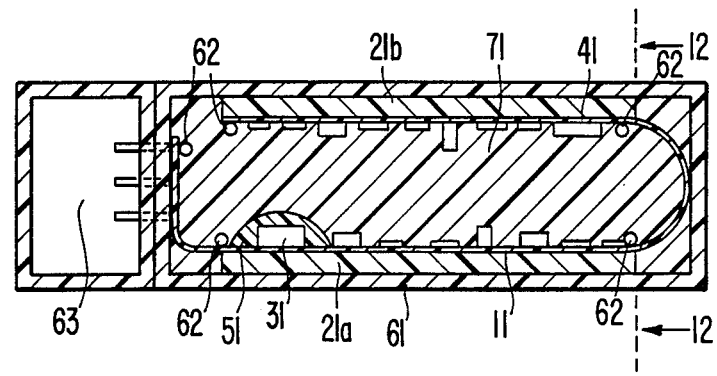
Figure 2:
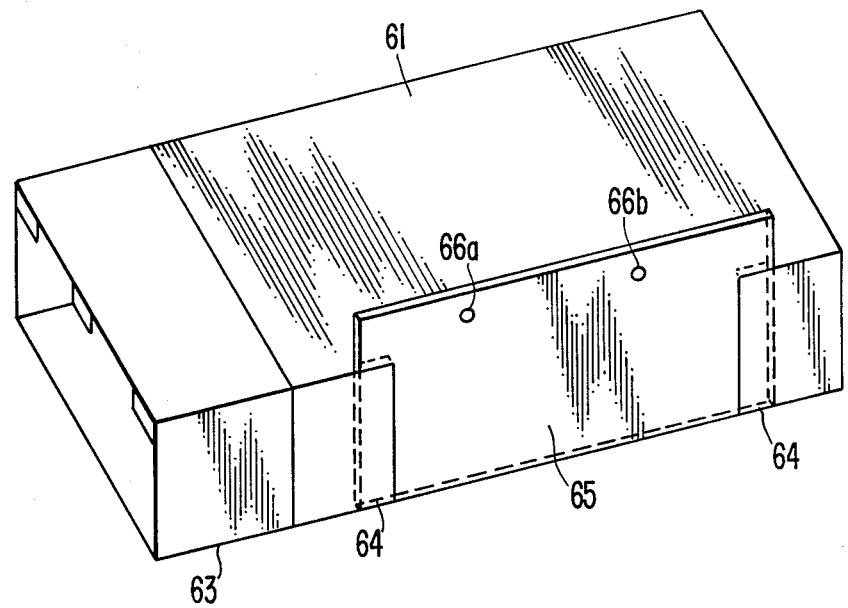

In FIG. 1 and FIG. 2, a 150 μm thick polyimide film 11 having an electronic circuit pattern for automobile suspension control is attached to two 1.6 mm thick paper phenol substrates 21a and 21b arranged at a prescribed interval 12 using a pressure sensitive adhesive double coated tape. A group of parts, including a heat-generating triode AC switch (TRIAC) 31, are mounted on the film 11 on the substrate 21a. A group of parts, including a low-heat-resistive microcomputer 41, are mounted on the film 11 on the substrate 21b. The triode AC switch 31 is coated, by using a dispenser, with an urethane resin containing 30 wt % of alumina and having a heat conductivity of 0.75 kcal/m·°C. By heating the urethane resin at 80° C. for 30 minutes, the triode AC switch 31 is covered with a resin layer 51 having good heat conductivity.

A case 61 having dimensions of 20×50×200 mm is made of a heat resistive ABS resin and has postioning pins 62 on its inner walls and a connector section 63 at its one side for connection to an external component. The polyimide film 11 is bent inward at the gap 12 formed between the substrate 21a and the substrate 21b so that the substrate 21a for the group of parts including the heat-generating part is opposite to the substrate 21b for the group of parts including the low-heat-resistive parts. That is, the substrate 21a and the substrate 21b were respectively disposed on the mutually opposing inner walls of the case 61 by the positioning pins 62. While maintaining the atmosphere temperature at 20° C., Y-3 (hard forming urethane resin of two liquid mixing type made by Asahi Glass Co., Ltd.) is injected into the case 61 to form a foam resin layer 71 having a poor heat conductivity of 0.032 kcal/m·hr·°C. and a thermal deformation temperature of 102° C. Thus, a space in the case 61, or a gap between the group of parts including the heat-generating part and the group of parts including the low-heat-resistive parts, is filled with the resin layer 71 of low heat conductivity. A cover 65, made of the heat resistive ABS resin and having tapped screw holes 66a and 66b, is inserted along insertion slots 64 provided on the case 61, thereby completing an electronic circuit module.

Incidentally, a resin of good heat conductivity can be obtained by adding a filler of good heat conductivity such as alumina and mica to a base resin such as epoxy resin, urethane resin, acryl resin, silicon resin and polybutadiene resin. The heat conductivity thereof is preferably at least 0.5 kcal/m·hr·°C. An injector, dispenser or brush may be used to cover the heat-generating part with the resin of good heat conductivity.

A resin layer of poor heat conductivity can be made of a foam resin such as polystyrene resin, urethane resin, polyethylene resin, phenol resin, urea resin and rubber, and preferably a foam resin which is foamed independently. By using jointly with fleon gas such as R-11, R-12 and R-113, a resin layer having a finer foam diameter is obtained, which has much lower head conductivity. The heat conductivity of such resibn layer is preferably at most 0.05 kcal/m·hr·°C. considering the insulation performance of the heat-generating part and the low-heat-resistive part. In the case where the electronic part mounted substrates have already been inserted into the case, it is desirable to mix the two liquids of a resin and a foaming agent and inject the mixture into the case to foam therein. Since a foam resin body which is causd to foam under pressure has a much lower head conductivity, it is possible to provide a resin layer of poor heat conductivity by using a method where the foam resin body is cut into blocks according to the shapes of the parts mounted on the substrate and such blocks are attached to the part mounted sides of the substrates by using an adhesive or a pressure sensitive adhesive double coated tape.

When the working atmosphere temperature and humidity conditions are taken into consideration, it is desirable for the heat resistance of the resin layer of poor heat conductivity and the resin of good heat conductivity used for covering the heat-generating part to have a thermal deformation temperature of at least 80° C.

Various characteristics of the electronic circuit module, fabricated in the above manner, were measured during an operating test of 100 hours in an 80° C. thermostatic bath, an operating test of 100 hours in a −30° C. thermostatic bath, a thermal shock test under 100 cycles of −40° C.×30 minutes and +85° C.×30 minutes conditions, and an operating test of 500 hours under 60° C./95%RH. The characteristics were evaluated for malfunction and faults due to wire cut offs or short-circuits during and after the tests. Table 1 shows the results of the tests.

TABLE 1

| | Characteristic Evaluation Test of Electronic Circuit Module | | | | | | | |
|---|---|---|---|---|---|---|---|---|
| | Operating test in a 80° C. thermostatic bath | | Operating test in a −30° C. thermostatic bath | | Thermal shock test under −40° C. × 30 min. + at 85° C. × 30 min. | | Operating test under 60° C./95% RH | |
| | During test | After test | During test | After test | During test | After test | During test | After test |
| Embodiment 1 | Normal | Normal | Normal | Normal | Normal | Normal | Normal | Normal |
| Embodiment 2 | Normal | Normal | Normal | Normal | Normal | Normal | Normal | Normal |
| Embodiment 3 | Normal | Normal | Normal | Normal | Normal | Normal | Normal | Normal |
| Embodiment 4 | Normal | Normal | Normal | Normal | Normal | Normal | Normal | Normal |
| Comparison 1 | malfunctions occurred | Normal | Normal | Normal | malfunctions occurred | Normal | Normal | Normal |
| Comparison 2 | malfunctions occurred | Normal | Normal | Normal | Fault due to cut off of wire occurred | Fault unrecovered | Normal | Normal |

As is apparent from Table 1, characteristics of the suspension control circuit module for an automobile were normal during and after every test.

Embodiment 2

Figure 3:
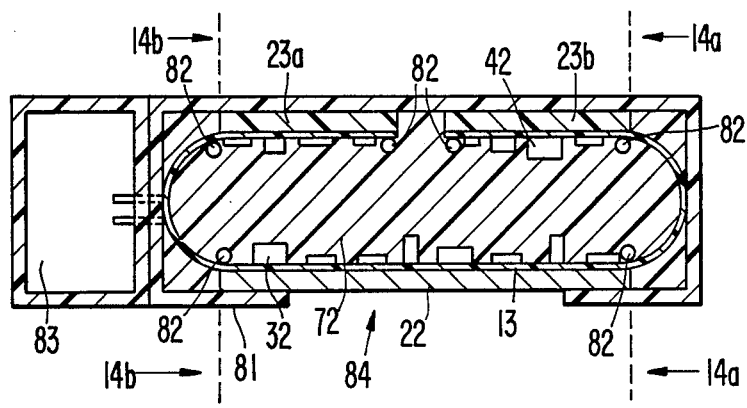
Figure 4:
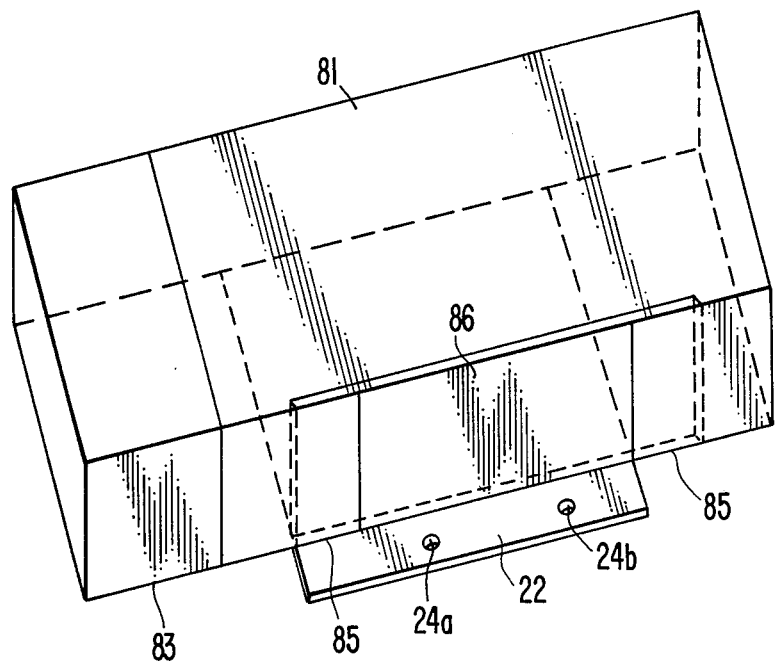

In FIG. 3 and FIG. 4, a 100 μm thich polyimide film 13 having an electronic circuit pattern for an instrument panel control of an automobile is change attached, by using a two liquid type epoxy resin adhesives free of solvent, to two 1.5 mm thick glass epoxy substrates 23a and 23b and a 1.5 mm thick aluminum substrate 22 having good heat conductivity of 185 kcal/m·hr·°C. The aluminum substrate, having tapped screw holes 24a and 24b, is provided with Alumite treatment for electrical insulation on the surface to which the film 13 is attached. The substrates 23a and 23b are disposed at prescribed intervals 14a and 14b respectively from both ends of the substrate 22. A group of parts including a heat-generating power transistor 32 are mounted on the film 13 on the substrate 22. A group of parts including a low-heat-resistive LSI 42 are mounted on the film 13 on the substrate 23b. Additional parts are also mounted on the film 13 on the substrate 23a.

A case 82 having dimensions of 15×60×250 mm and made of a melamine resin has positioning pins 82 on its inner walls and a connector section 83 at one side for connection to an external component. The case 81 is also provided with an opening 84 where part of the substrate 22 having good heat conductivity is exposed. So that the substrate 22 having the group of parts including the heat-generating part and the substrate 23b having the group of parts including the low-heat-resistive part are facing opposite each other, the polyimide film 13 is bent inwardly at a gap 14a between the substrate 23b and the substrate 22 and at a gap 14b between the substrate 23a and the substrate 22. The substrate 23b and the substrate 23a are inserted on the same inner wall of the case 81 and between the positioning pins 82, and the subtrate 22 is inserted on the opposite inner wall of the case 81 and the between positioning pins 82. While maintaining the atmospheric temperature at 40° C., Aerofroth (one liquid type hard foam urethane resin made by Nihon Polyurethane Industry Co., Ltd.) is injected into the case 81 to foam to form a resin layer 72 having a poor heat conductivity of 0.025 kcal/m·hr·°C. and a thermal deformation temperature of 95° C. Thus, the space within the case 81, that is the gap between the group of parts including the heat-generating part and the group of parts including the low-heat-resistive part, is filled with the resin layer 72 of low heat conductivity. A cover 86 made of melamine resin is inserted along insertion slots 85 provided on the case 81, thereby completing electronic circuit module.

Incidentally, the substrate 22 of good heat conductivity can be easily obtained by applying an insulating process to a metal or alloy such as aluminum, copper and brass. It is desirable that the heat conductivity of the substrate 22 (for releasing heat from the heat-generating part of a fast rate) be at least 50 kcal/m·hr °C., and more preferably at least 100 kcal/m·hr·°C.

The electronic circuit module fabricated in the above was subjected to the same tests as those applied to embodiment 1. Table 1 shows the results of the evaluation. As is apparent from Table 1, characteristics of the instrument panel control circuit module for an automobile were normal during and after every test.

Embodiment 3

Figure 5:
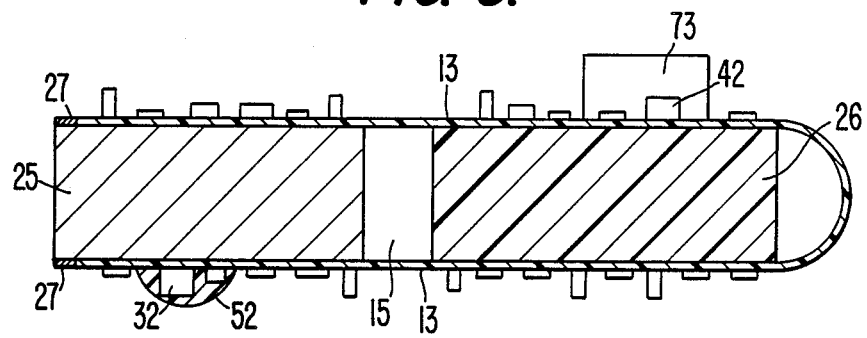

In FIG. 5, a 100 μm thick polyimide film 13 having an electronic circuit pattern for the instrument panel of an automobile and a connection terminal 27 at both ends thereof is attached using a two liquid, solvent free epoxy resin adhesive to both major surfaces of a 1.6 mm thick copper substrate 25 having good heat conductivity and processed with electrical insulation treatment and to both of a 1.6 mm thick paper polyester substrate 26, arranged at a prescribed interval 15. A group of parts including a heat-generating power transistor 32 are mounted on the film 13 on the lower side of the substrate 25. A group of parts including a low-heat-resistive LSI 42 are on the film 13 on the upper side of the substrate 26. Additional parts are also mounted on the film 13 on the upper side of the substrate 25 and on the lower side of the substrate 26. The power transistor 32 is covered, by using an injector with a urethane resin containing 25 wt % of mica and having a heat conductivity of 0.60 kcal/m·hr·°C. By heating the urethane resin at 100° C. for 20 minutes, the power transistor 32 is covered with a resin layer 52 having good heat conductivity.

A block of foam phenol resin 73 (which has been individually foamed by jointly using fleon gas R-113) of 0.016 kcal/m·hr·°C. heat conductivity is partly hollowed out in the shape of the LSI 42 and other adjacent parts, and attached to the film 13 to cover the LSI 42 using a pressure sensitive adhesive double coated tape.

The electronic module fabricated in the above manner was subjected to the same tests as those applied to embodiment 1. Results of the evaluation are shown in Table 1.

As is apparent from Table 1, characteristics of the instrument panel control circuit module for an automobile were normal during and after every test.

Embodiment 4

Figure 6:
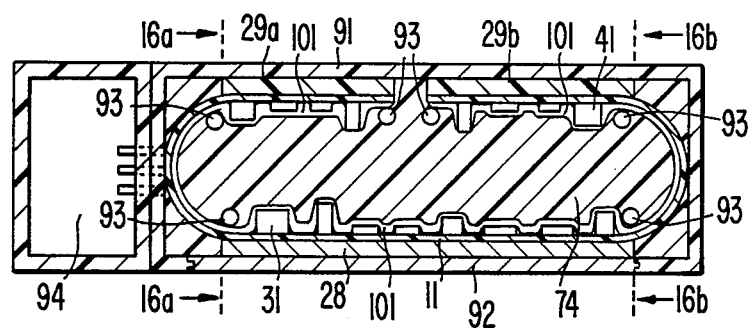

In FIG. 6, a 150 μm thick polyimide film 11 having an electronic circuit pattern for the suspension control of an automobile is attached, using pressure sensitive adhesive double coated tape, to two substrates 29a and 29b of poor head conductivity, each comprising a 1.5 mm soflan phenol board (flame retardent foam phenol resin made by Toyo Rubber Industry Co., Ltd.) having a 0.018 kcal/m·hr·°C. heat conductivity, and to one 1.5 mm thick aluminum substrate 28 having a good heat conductivity of 185 kcal/m·hr·°C. and processed with Almite treatment or the surface to which the film 11 is attached for electrical insulation. The substrates 29a and 29b are disposed at prescribed gaps 16a and 16b respectively from both ends of the substrate 28. A group of parts including a heat-generating triode AC switch 31 are mounted on the film 11 on the substrate 28. A group of parts including a low-heat-resistive microcomputer 41 are mounted on the film 11 on the substrate 29b. Additional parts are also mounted on the film 11 on the substrate 29a. All of the parts mounted on the film 11 in the above manner are coated with an urethane resin of 100 cps viscosity by using a spray gun. By hardening the resin coat at 80° C. for 30 minutes, the electronic parts on the film 11 are covered with a 50 μm thick moisture proof coating 101.

A case 91 having dimensions of 20×50×200 mm has positioning pins 93 on its inner wals and a connector section 94 at one side, and is made of a heat resisting ABS resin and partly of an aluminum plate 92 having its inner surface processed with insulation treatment. In order that the substrate 28 including the heat-generating part and the substrate 29b including the low-heat-resistive part are disposed opposite each other, the polyimide film 11 is bent inwardly at the gap 16a between the substrate 29a and the substrate 28 and the gap 16b between the substrate 29b and the substrate 28. The substrate 28 is disposed on the inner surface of the aluminum plate 92 by using the positioning pins 92 and the substrate 29b and the substrate 29a are disposed on the inner wall of the case 91 opposite the inner surface of the aluminum plate 92 by using the positioning pins 92.

While maintaining the atmospheric temperature at 25° C. C-5 (two liquid type hard foam urethane resin of Asahi Glass co., Ltd.) is injected into the case 91 to foam, thereby to forming a resin layer 74 having a poor heat conductivity of 0.038 kcal/m·hr·°C. and a thermal deformation temperature of 105° C. The space within the case 91, that is the gap between the group of parts including the heat-generating part and the group of parts including the low-heat-resistive part, is filled with the resin layer 74 of low heat conductivity. In this way, construction of the electronic circuit module is completed.

Incidentally, the resin layer having poor heat conductivity can be easily made uninflammable by adding an uninflammable agent such as haloganated phosphate, boric acid, antimony phophate and antimony polyphosphate individually or jointly with an uninflammability promoting agent such as hydrate alumina and borax. The moisture resistance of the module can be improved by applying a moisture resistant treatment to the electronic circuit module by spraying or dipping in urethane resin, epoxy resin and acryl resin before forming the resin layer having poor heat conductivity. The first and second groups of electronic components and the circuit pattern of the flexible film are coated with a moisture proof coating material.

The electronic circuit module fabricated in the above manner was subjected to the same tests as those applied to embodiment 1. Results of the evaluation are shown in Table 1. As is apparent from Table 1, characteristics of the suspension control circuit module for an automobile were normal during and after every test.

COMPARISON EXAMPLE 1

Figure 7:
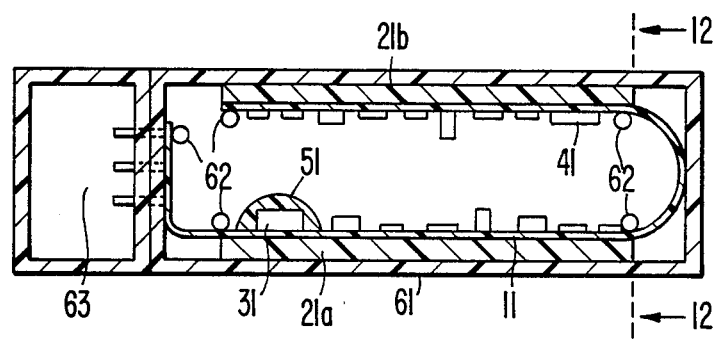

In FIG. 7, the electronic module shown is different in structure from that of embodiment 1 only in that the space within the case 61 is not filled with a resin layer having poor heat conductivity but is instead kept filled with air. The characteristics of such a circuit module were evaluated in the same manner as in the case of embodiment 1. The evaluation results are shown in Table 1.

As is apparent from Table 1, the characteristics of the circuit module of this comparison example were normal during and after the operating test having the $-30°$ C. thermostatic bath and the operting test under 60° C./95%RH. However, malfunctions occurred having the operating test in the 80° C. thermostatic bath and in the thermal shock test. This is because the low-heat-resistive part heats up to a temperature exceeding the maximum operating temperature.

COMPARISON EXAMPLE 2

Figure 8:
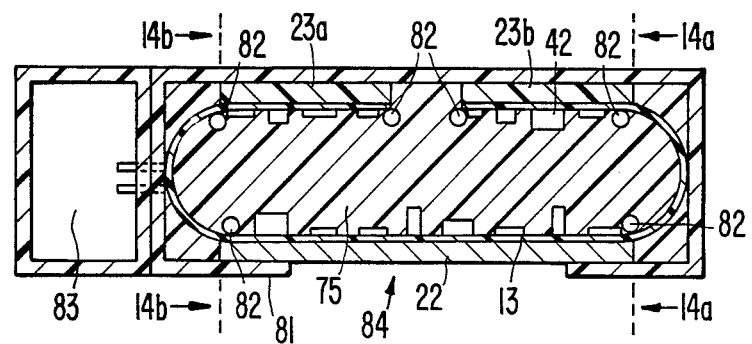

In FIG. 8, the electronic circuit module shown is different from embodiment 2 only in the kind of resin used for filling the inner space of the case 81. A two liquid type epoxy resin comprising bisphenol A containing 30 wt% of quartz powder and aromatic amine-based hardener is poured inside the case 81. By hardening the poured resin at 80° C. for 60 minutes, a resin layer 75 having 0.26 kcal/m·hr·°C. heat conductivity is formed. The gap between the electronic parts mounted substrates is therefore filled with the resin layer 75.

The characteristics of a circuit module of this type were evaluated in the same manner as in the case of embodiment 1. Results of the evaluation are shown in Table 1.

As is apparent from Table 1, the characteristics of the circuit module of comparison example 2 were normal during and after the operating test having the $-30°$ C. thermostatic bath and the operating test under 60° C./95%RH. However, malfunctions occurred having the operating test in the 80° C. thermostatic bath, and faulty characteristics were caused in the thermal shock test due to breakage of wire. The faulty characteristics were not recovered after the test. These malfunctions and faults are caused because the low-heat-resistive part heats up to a temperature exceeding the maximum operating temperature.

What is claimed is:

1. An electronic circuit module comprising:
   a case;
   first and second substrates respectively disposed on opposite inner walls of said case with a predetermined gap therebetween;
   a flexible film having thereon a circuit pattern, wherein said flexible film has a part affixed to said first substrate and has another part affixed to said second substrate;
   a first group of electronic components mounted on said flexible film at said part affixed to said first substrate, wherein said first group of electronic components includes a heat generating component;
   a second group of electronic components mounted on said flexible film at said another part affixed to said second substrate, wherein said second group of electronic components includes a low-heat-resistive component; and
   a resin layer having a low heat conductivity, said resin layer filling a gap betweensaid first group of electronic components and said second group of electronic components so that heat generated by said heat-generating component is not transferred to said low-heat-resistive component.

2. An electronic circuit module according to claim 1, wherein said heat-generating component is covered with a resin layer having a high heat conductivity.

3. An electronic circuit module according to claim 2, wherein said heat conductivity of said resin layer covering said heat-generating component is at least 0.5 kcal/m·hr·°C.

4. An electronic module according to claim 2, wherein said resin layer covering said heat-generating component has a thermal deformation temperature of at least 80° C.

5. An electronic circuit module according to claim 1, wherein said first substrate has a high heat conductivity.

6. An electronic circuit module according to claim 5, wherein said heat conductivity of said first substrate is at least 50 kcal/m·hr·°C.

7. An electronic circuit module according to claim 5, wherein said first substrate is a metal substrate, and wherein a surface of said first substrate to which said flexible film is attached is insulated.

8. An electronic circuit module according to claim 5, wherein a wall of said case on which said first substrate is disposed has an opening so that said first substrate is exposed at said opening to enhance heat radiation.

9. An electronic circuit module according to claim 1, wherein the heat conductivity of said resin layer is at most 0.05 kcal/m·hr·°C.

10. An electronic circuit module according to claim 1, wherein said resin layer has a thermal deformation temperature of at least 80° C.

11. An electronic circuit module according to claim 1, wherein said resin layer is a foam resin body.

12. An electronic circuit module according to claim 11, wherein said resin layer is a foam resin body of urethane resin or phenol resin.

13. An electronic circuit module according to claim 1, wherein said resin layer is uninflammable.

14. An electronic circuit module according to claim 1, wherein said first and second groups of electronic components and said circuit pattern on said flexible film are coated with a moisture proof coating material.

* * * * *